United States Patent
Sukegawa et al.

(10) Patent No.: US 6,169,698 B1
(45) Date of Patent: Jan. 2, 2001

(54) VOLTAGE GENERATING CIRCUIT FOR SEMICONDUCTOR MEMORY SENSE AMPLIFIER

(75) Inventors: Shunichi Sukegawa, Tsukuba; Shinji Bessho, Suita; Masayuki Hira, Tokorozawa; Yasushi Takahashi, Urawa; Tsutomu Takahashi, Tachikawa; Koji Arai, Kodaira, all of (JP)

(73) Assignees: Texas Instruments Incorporated, Dallas, TX (US); Hitachi, Ltd., Tokyo (JP)

( * ) Notice: Under 35 U.S.C. 154(b), the term of this patent shall be extended for 0 days.

(21) Appl. No.: 09/189,076

(22) Filed: Nov. 9, 1998

(30) Foreign Application Priority Data

Nov. 10, 1997 (JP) .................................... 9-307714

(51) Int. Cl.[7] ...................................... G11C 7/00
(52) U.S. Cl. ................. 365/226; 365/205; 365/189.07; 365/149
(58) Field of Search ................. 365/226, 205, 365/189.07, 149, 189.11

(56) References Cited

U.S. PATENT DOCUMENTS 5,373,477 * 12/1994 Sugibayashi ......................... 365/226
5,673,232 * 9/1997 Furutani ............................... 365/226
5,742,588 * 4/1998 Hashimoto ......................... 365/233.5
5,822,267 * 10/1998 Watanabe et al. .................... 365/227
5,875,133 * 2/1999 Miyashita et al. ............. 365/189.09
5,886,964 * 3/1999 Ooishi .................................. 365/233

* cited by examiner

Primary Examiner—Richard Elms
Assistant Examiner—Tuan T. Nguyen
(74) Attorney, Agent, or Firm—William B. Kempler; Frederick J. Telecky, Jr.

(57) ABSTRACT

Drop in the power supply level right after change can be suppressed greatly when changing the power to the internal power supply voltage from the external power supply voltage of an overdrive system. Voltage generating circuit VG0 is connected to the $V_{DL}$ line which raises the $V_{DL}$ line to a voltage higher than $V_{DL}$ beforehand prior to changing to internal power supply voltage $V_{DL}$ from external power supply voltage $V_{DD}$, and restores the $V_{DL}$ line voltage which drops after the change to $V_{DL}$. More specifically, there are detecting circuit part 40 which detects the $V_{DL}$ line potential, first switching element M1 connected between the $V_{DL}$ line and the $V_{DD}$ line and which operates according to the detected result of detecting circuit part 40, and second switching element M2 connected between common voltage $V_{SS}$ and connection node ND1 between first switching element M1 and detecting circuit part 40, which changes the potential of connection node ND1 by conducting according to input preliminary voltage step up signal MVDL, and by it conducts first switching element M1 for a fixed time.

10 Claims, 4 Drawing Sheets

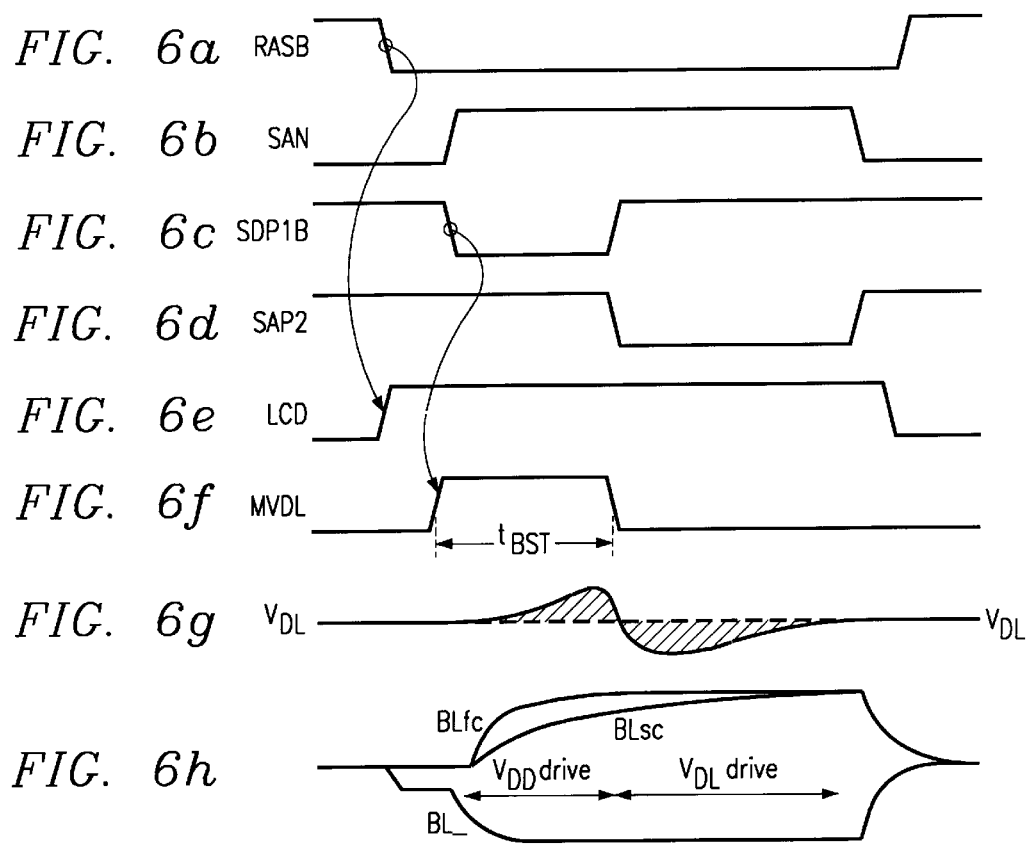
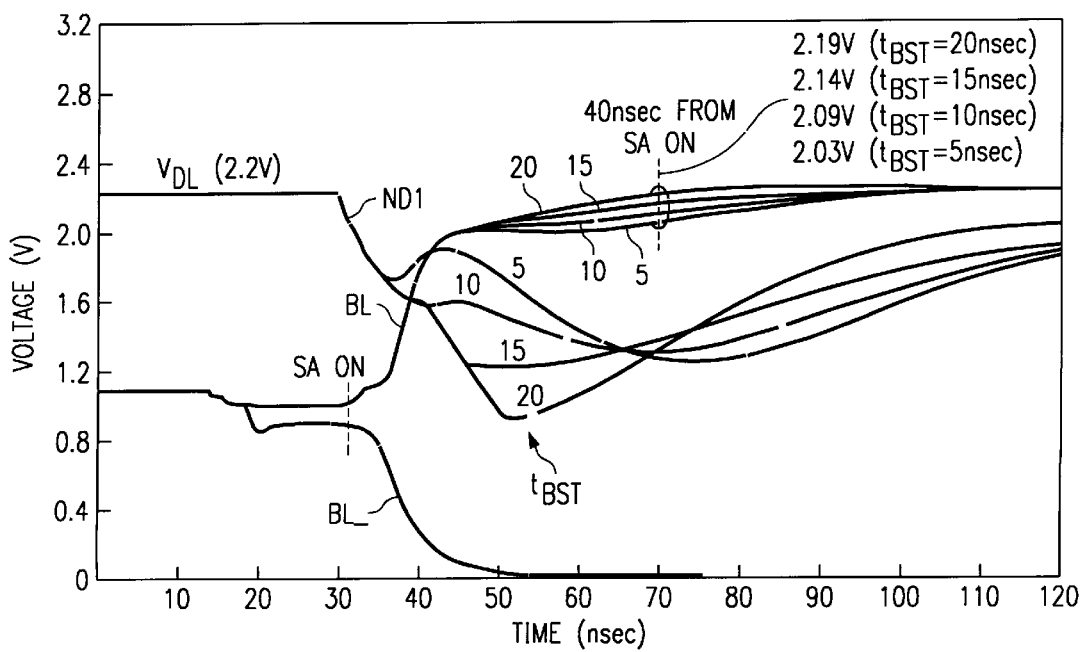
FIG. 7

VOLTAGE GENERATING CIRCUIT FOR SEMICONDUCTOR MEMORY SENSE AMPLIFIER

FIELD OF THE INVENTION

The present invention relates to a semiconductor memory which reads data according to the so-called overdrive system which drives at a higher external power supply voltage for a fixed time at the beginning of the build-up of a sense amplifier driven with an internal power supply voltage.

BACKGROUND OF THE INVENTION

In a semiconductor memory such as a DRAM, etc., along with miniaturization of the cell array, internal power supply voltage $V_{DL}$, which is generated when external power supply voltage $V_{DD}$ is stepped down on the inside of the memory array, is often used in order to secure the gate breakdown voltage thereof. When the power supply voltage is stepped down, a decrease in the access speed cannot be avoided in a sense amplifier connected to each memory cell, so the sense amplifier drive system (hereafter referred to as overdrive OVD system) which feeds a higher external power supply voltage $V_{DD}$ for a fixed time at the beginning of the build-up (until reaching the internal operating voltage) is used.

However, step down in the voltage originating in the power line resistance according to the arrangement of the sense amplifier array cannot be ignored in said overdrive system so the optimal overdrive value of the sense amplifier differs between the sense amplifier arrays even within the same array block.

Therefore, the overdrive value is optimized based on the worst case in order to secure sufficient writing as a whole in, for example, the conventional 64 Mb (megabit) DRAM. Accurate operation of the sense amplifier in the farthest end (worst case) can be secured in accordance with this but the overdrive becomes excessive on the near end side and the excessive charge accompanying excessive overdrive was discarded. Namely, excess external power supply voltage was impressed during the memory access in the near end sense amplifier and this caused characteristic degradation of the transistor composing the sense amplifier, and unnecessary power consumption was unavoidable.

In order to suppress said unnecessary power consumption, it is necessary to minimize the overdrive value as much as possible within the range of being able to secure accurate operation of the sense amplifier at the farthest end, but in an actual DRAM, the reality was that the overdrive time was set longer than necessary in order to avoid a drop during the power change in the overdrive. Namely, the internal operating voltage (bit line voltage) of the sense amplifier array during overdrive had to be sufficiently increased to a higher voltage after reaching the voltage level sufficient for the sense amplifier, namely, to a voltage capable of avoiding a drop during the power change.

Specifically, for example, if external power supply voltage $V_{DD}$ is 3.3 V and internal power supply voltage $V_{DL}$ is 2.2 V, a voltage of about 2.0 V is necessary to be able to avoid a drop during the power change. In this case, when it is changed from external power supply voltage $V_{DD}$ to internal power supply voltage $V_{DL}$ before the bit line potential reaches 2.0 V, the level of internal power supply voltage $V_{DL}$ suddenly steps down the instant the power changes because the driving ability of the internal power generated within the chip is weaker than the external power. This drop in the power level is sensed by a generator which generates internal power supply voltage $V_{DL}$, the generator begins stepping up the output voltage, and the feed line of internal power supply voltage $V_{DL}$ is restored to a voltage level sufficient for sense amplifier operation after a fixed time.

Conventionally, it was necessary to set a long overdrive time and to change the power after the bit line voltage of the sense amplifier has become a sufficient voltage (e.g., near 2.2 V) and after it has exceeded the voltage level capable of operating the sense amplifier in order to avoid said great drop (undershoot) in the power level. As a result, though great undershoot caused by power change could be avoided even in the sense amplifier array of the farthest end, there were problems that the overdrive time was long, it was difficult to reduce the cycle time for reading the data, and high speed data readout in the conventional OVD system readout could not be achieved.

The present invention was reacted considering said situation, and the objective is to provide a semiconductor memory for enhancing the speed by greatly suppressing the drop in the power level immediately after change when changing the power from a high external power supply voltage to a low internal power supply voltage during the activation of a sense amplifier like, for example, the overdrive system.

SUMMARY OF THE INVENTION

In order to solve said problems in the conventional technology and in accordance with one aspect of the invention the semiconductor memory of the present invention is a semiconductor memory which reads data by changing the power supply voltage feed line connected to the drive line of the sense amplifier to the feed line of internal power supply voltage from the feed line of external power supply voltage after initially activating the sense amplifier with external power supply voltage, and a voltage generating circuit which steps up the feed line voltage of said internal power supply voltage beforehand to a voltage higher than the working voltage prior to said change and restores said feed line voltage which stepped down after the change to said working voltage is connected to the feed line of said internal power supply voltage.

According to another aspect of the invention said voltage generating circuit has a detecting circuit part which detects the potential of the feed line of said internal power supply voltage, a first switching element connected between the feed line of said internal power supply voltage and the feed line of the external power supply voltage, and which is operated according to the detection result of said detecting circuit part, and a second switching element connected between the connection node of said detecting circuit part and said first switching element and the common voltage feed line, which changes the potential of said connection node by conducting according to the input voltage step up signal, and by it conducting said first switching element for a fixed time prior to said change.

Said detecting circuit part is composed of a comparing circuit which compares the partial pressure of said feed line voltage with a prescribed reference voltage and drives said first switching element according to the comparison result.

Also, a capacitor is provided which is connected between the feed line of said internal power supply voltage and the common voltage feed line, and the accumulated charge value increases as said feed line voltage is stepped up to a voltage higher than the working voltage beforehand. In order to enhance the response property by utilizing the capacitive coupling according to this capacitor, it is preferable to connect a capacitor between the potential detection node of said detecting circuit part and the feed line of said internal power voltage and between said potential detection node and common voltage feed line.

In the semiconductor memory with this type of constitution, said second switching element within the voltage producing circuit is conducted for a fixed time prior to power change. According to this conduction of the second switching element, the potential of the input node of the first switching element changes as if the potential of the feed line of the internal power supply voltage has stepped down. Therefore, the first switching element is conducted for a while and just for this period, the feed line of the internal power supply voltage steps up to a voltage higher than the working voltage connected to the feed line of the external power supply voltage. Due to the feed line of the pertinent internal power supply voltage being connected to the drive line of the sense amplifier in this state of the voltage having stepped up, even if there is a step down in the potential due to power change, the pertinent feed line voltage does not fall below the bottom limit voltage level sufficient for sense amplifier operation, or even if it falls below the pertinent voltage level, the decrease value is less than in the conventional technology and restoration of the potential according to the voltage generating circuit in the feed line of internal power supply voltage is that much faster.

In particular, in a constitution of this invention, a capacitor is connected to the potential detection node, in addition to the feedback being fast due to the drop in the voltage level of the internal power supply voltage being transmitted to the detecting circuit part via the capacitive coupling, the insufficient charge during the power change is immediately replenished by the accumulated charge of this capacitor and the voltage step up value thereafter according to the voltage generating circuit itself can be minimal.

Preferably, a plurality of voltage producing circuits of this configuration is provided for each memory array or for each memory block composed of multiple memory arrays and are scattered within an area where the peripheral circuits of the memory arrays are formed. In said scattered voltage generating circuits, in addition to the degree of freedom in the arrangement being high since the individual voltage feeding ability can be low and the area is small, the load of the wiring capacity, etc., per voltage generating circuit is small so the feedback from when the power supply voltage has stepped down till restoring the potential to the working value becomes faster.

BRIEF DESCRIPTION OF THE DRAWINGS

FIG. 6 is a timing chart showing the operation of the VDL generator.

FIG. 7 is a figure showing the result obtained by simulating the potential change in the bit counterline and node (ND1) with the pulse width of preliminary voltage step up signal (MVDL), namely, preliminary voltage step up time as the parameter.

Figure 1:
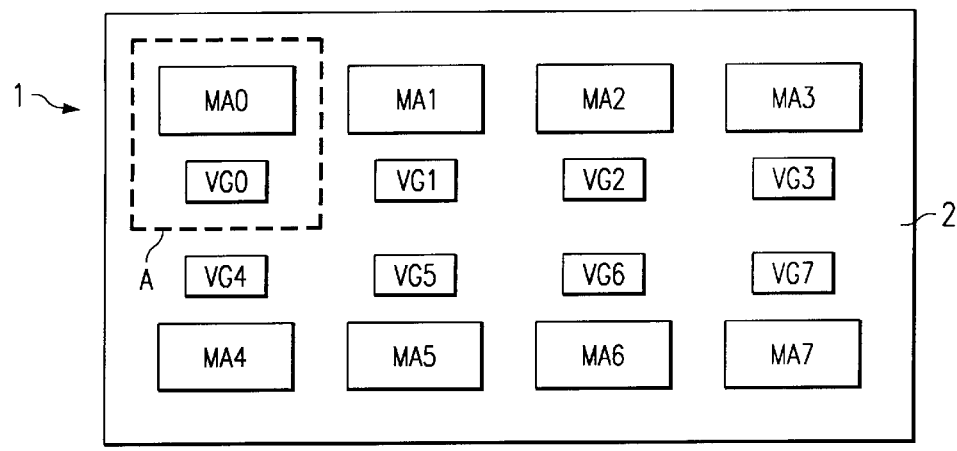
FIG. 1 is a schematic top view showing the overall structure of a 64 Mb DRAM related to an embodiment of the present invention.

REFERENCE NUMERALS AS SHOWN IN THE DRAWINGS 1 is a 64 Mb DRAM (semiconductor device), 10 and 10$a$ are feed lines of power supply voltage $V_{DD}$, 20 and 20$a$ are feed lines of common voltage $V_{SS}$, 30 and 30$a$ are feed lines of internal power supply voltage $V_{DL}$, 40 is a VDL sensor (detecting circuit part), AC0 is an array control circuit, MA0, etc. a memory array block, M0, etc. a memory cell matrix, SB0, etc. a sense amplifier bank, SA a sense amplifier, and VG0, etc. a VDL generator.

Below, a semiconductor memory related to the present invention will be explained in detail with reference figures. by using a 64 Mb (megabit) DRAM with multidivided memory arrays as an example.

Figure 3:
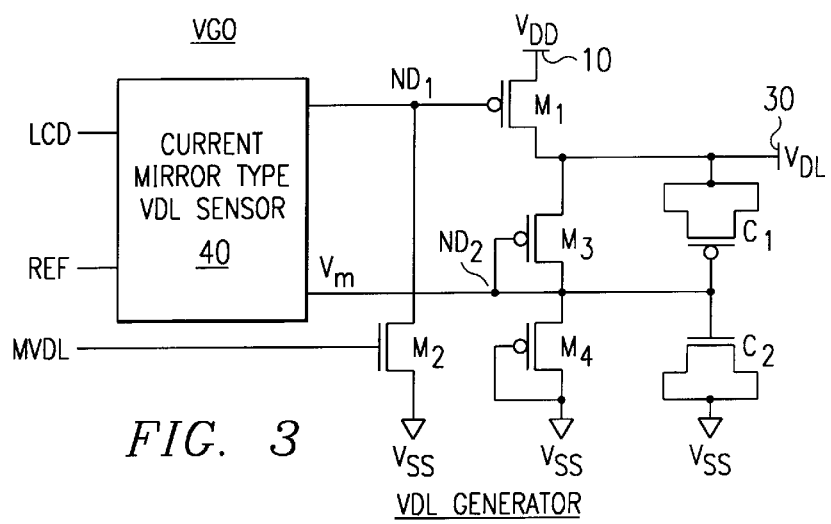
FIG. 3 is a circuit block diagram showing a schematic configuration of the VDL generator.
Figure 2:
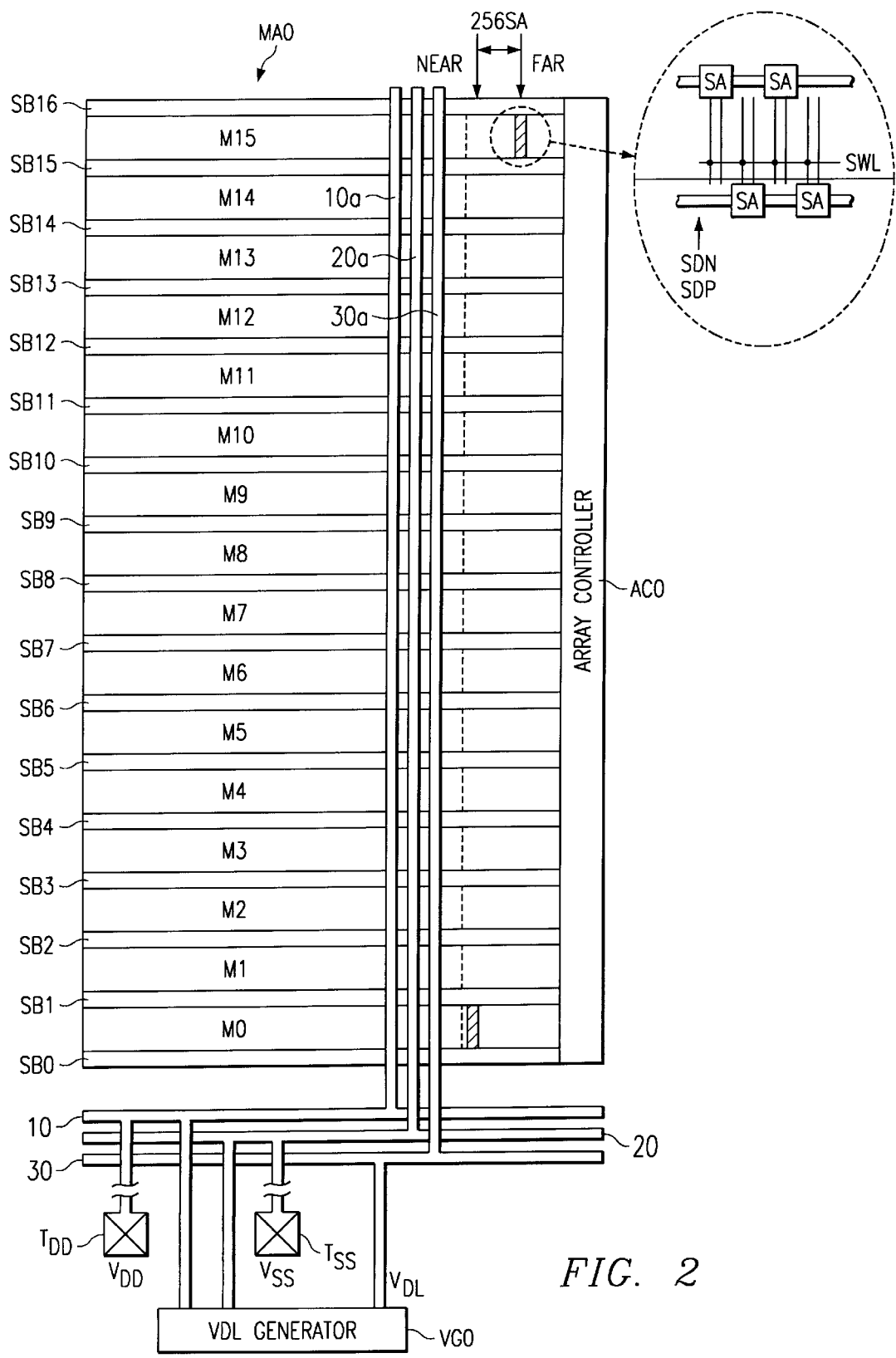
FIG. 2 is a schematic top view showing an enlargement of part A in FIG. 1.

FIG. 1 is a schematic top view showing the overall structure of the 64 Mb DRAM related to this embodiment. FIG. 2 is a schematic top view showing an enlargement of part A in FIG. 1, and FIG. 3 is a circuit configuration showing an enlargement of the VDL generator in FIG. 1.

This 64 Mb DRAM 1 is comprised of 8 memory array blocks MA0–MA7, each having a storage capacity of 8 Mb and peripheral circuit area 2 provided between said blocks as shown in FIG. 1.

One memory array block is composed of memory cell mats M0–M15 and sense amplifier banks SB0–SB16 and is connected to array control circuit AC0 provided respectively to peripheral circuit area 2 as shown, for example, in FIG. 2 by being represented by MA0. Each memory cell mat has, for example, storage capacity of 512 Kb (kilobits). Array control circuit AC0 is a circuit which controls the overall operation of the memory cell mats.

In the DRAM of this example, DWD (divided word line drive) system is used, and the word line is composed into a hierarchy of main word line MWL (not shown in the FIGS.) and subword line SWL. Though not shown in the FIGS. in particular, only one main word line driving circuit is provided for each of memory cell mats M0–M15, but the subword line driving circuit is arranged for each block of 64 Kb in each memory cell mat. Also, a memory cell is arranged at each intersecting point of bit counter line extended from sense amplifier SA within the sense amplifier bank and subword line SWL extended from the subword line driving circuit as shown in the enlarged portion of FIG. 2.

Memory array internal feed lines 10$a$, 20$a$, and 30$a$ of power supply voltage $V_{DD}$, common reference voltage $V_{SS}$, and internal power supply voltage $V_{DL}$ are wired on each arranged area of the subword line driving circuit by passing through between memory cell mats M0–M15 in the vertical direction in FIG. 2. These voltage feed lines are connected to feed lines 10, 20, and 30 of power supply voltage $V_{DD}$, common reference voltage $V_{SS}$, and internal power supply voltage $V_{DL}$ wired in peripheral circuit area 2. Power supply voltage $V_{DD}$ and common reference voltage $V_{SS}$ are fed by being input from the outside to terminals $T_{DD}$ and $T_{SS}$, respectively.

On the contrary, internal power supply voltage $V_{DL}$ is generated by internal power supply voltage generating circuit (VDL generator). VDL generators are scattered at positions within peripheral circuit area 2 corresponding to memory array blocks MA0–MA7 as shown in FIG. 1. These VDL generators VG0–VG7 are voltage generating circuits provided with the function of making internal power supply voltage $V_{DL}$ higher than the working voltage thereof by controlling the time for connecting internal power supply voltage line ($V_{DL}$ line) to external power supply voltage line $V_{DD}$. VDL generators VG0–VG7 are connected to feed lines 10), 20, and 30 of external power supply voltage $V_{DD}$, common reference voltage $V_{SS}$, and internal power supply voltage $V_{DL}$ as shown in FIG. 2. In this example, external power supply voltage $V_{DD}$ is 3.3 V, common reference voltage $V_{SS}$ is 0 V, and internal power supply voltage $V_{DL}$ is 2.2 V.

Figure 4:
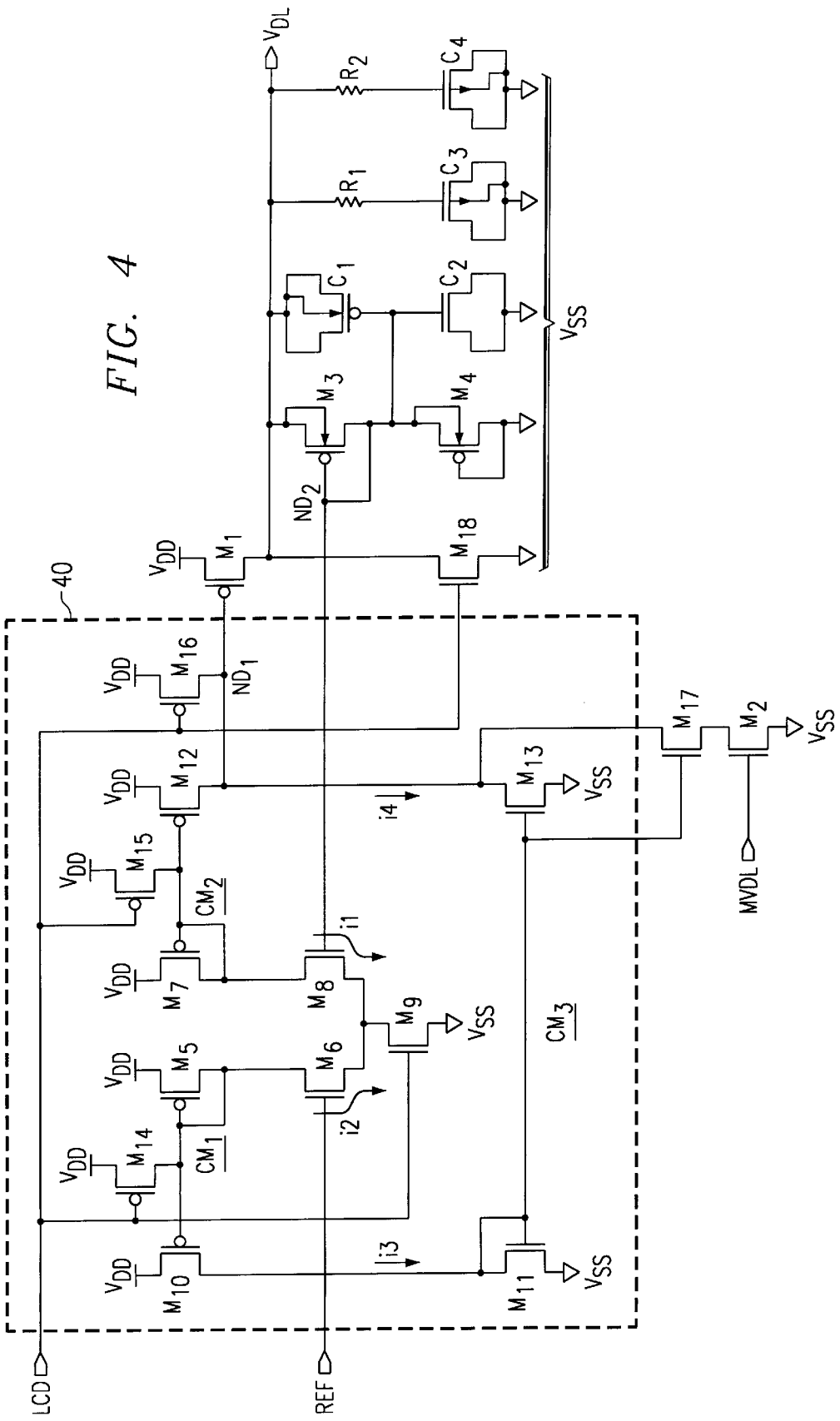
FIG. 4 is a more detailed circuit configuration of the VDL generator.

FIG. 3 is a figure showing the schematic configuration of said VDL generator and FIG. 4 is a more detailed circuit configuration.

VDL generator VG0 shown in FIG. 3 has control circuit 40 (here it is referred to as current mirror VDL sensor) which detects the level of the internal power supply voltage and compares it with the reference value. Enabling signal LCD which enables the VDL sensor only during the data readout period and voltage REF which becomes the reference for the generated voltage are input to VDL sensor 40.

Also, VDL generator VG0 is connected between $V_{DD}$ line 10 and $V_{DL}$ line 30 and has first switching element (pMOS transistor M1) in which the cutoff/conduction is controlled according to the result of VDL sensor 40 and second switching element (nMOS transistor M2) in which cutoff/conduction is controlled according to preliminary voltage step up signal MVDL. pMOS transistor (M1) is a transistor which drives the voltage step up of $V_{DL}$ line (30) and nMOS transistor M2 is a transistor which conducts when the logical state of preliminary voltage step up signal MVDL is "high (H)" and mandatorily steps down the voltage of input node ND1 of pMOS transistor M1 for just a prescribed time when it is in said state. pMOS transistor M1 is conducted excessively according to the conduction of nMOS transistor M2, and $V_{DL}$ line 30 is stepped up to be greater than internal power supply voltage $V_{DL}$.

Potential dividing pMOS transistors M3 and M4 which are respectively diode connected are serially connected between the $V_{DL}$ line and the feed line ($V_{SS}$ line) of common voltage $V_{SS}$. pMOS transistors M3 and M4 are both connected with gate and drain and the drain of pMOS transistor M3 and the source of pMOS transistor (M4) are connected. Also, the source of pMOS transistor M3 is connected to the $V_{DL}$ line and the drain of pMOS transistor M4 is connected to the $V_{SS}$ line. Monitor voltage $V_m$ is fed to VDL sensor 40 from connection node ND2 of pMOS transistors M3 and M4.

Also, two capacitors C1 and C2 are similarly connected serially between the $V_{DL}$ line and the $V_{SS}$ line. The two capacitors in this example are composed of p-type and n-type MOS transistors in which the source and the drain are commonly connected. The gates of the p-type and n-type MOS transistors are mutually connected and coupled to node ND2, the source and drain of the pMOS transistor are connected to the $V_{DL}$ line, and the source and drain of the nMOS transistor are connected to the $V_{SS}$ line. Capacitors C1 and C2 with this type of configuration accumulate charge when the $V_{DL}$ line has been stepped up to be greater than internal power supply voltage $V_{DL}$ along with transmitting the fall in the potential of $V_{DL}$ line immediately to node ND2.

Within VDL sensor 40, a set of pMOS transistor MS and nMOS transistor M6 and a set of pMOS transistor M7 and nMOS transistor M8 serially connected with respect to the $V_{DD}$ line are mutually connected at a parallel as shown in FIG. 4. Namely, the sources of pMOS transistors MS and M7 are connected to the $V_{DD}$ line and the drains of pMOS transistors MS and M7 are connected respectively to the drains of nMOS transistors M6 and M8. nMOS transistors M6 and M8 compose a differential pair in which the source is connected in common, said reference voltage REF is impressed to the gate of nMOS transistor M6, and the gate of nMOS transistor M8 is connected to voltage monitoring node ND2. nMOS transistor M9 for differential pair activation is connected between the $V_{SS}$ line and the common source of nMOS transistors M6 and M8. Enabling signal LCD is input to the gate of nMOS transistor M9.

On the other hand, pMOS transistors MS and M7 compose first and second current mirror circuits CM1 and CM2, respectively, between other pMOS transistors M10 and M12. Namely, the gate and drain of pMOS transistor MS are coupled reciprocally and connected to the gate of pMOS transistor M10 in which the source is connected to the $V_{DD}$ line. Similarly, the gate and the drain of pMOS transistor M7 are coupled reciprocally and connected to the gate of pMOS transistor M12 in which the source is connected to the $V_{DD}$ line.

A pull up pMOS transistor is respectively connected to the common gate of said two current mirror circuits CM1 and CM2. Pull up pMOS transistor M14 is connected between the $V_{DD}$ line and the common gate of pMOS transistors MS and M10, and pull up pMOS transistor M15 is connected between the $V_{DD}$ line and the common gate of pMOS transistors M7 and M12. These pull up pMOS transistors M14 and M15 are cutoff when an enabling signal LCD of a high level is input to the gate thereof.

nMOS transistors M11 and M13 are respectively connected between the $V_{SS}$ line and the drain of pMOS transistor M10 and between the $V_{SS}$ line and pMOS transistor M12. Third current mirror circuit CM3 is composed according to nMOS transistors M11 and M13. Namely, the drain and the gate of nMOS transistor M11 are coupled and connected to the gate of nMOS transistor M13.

The connection point of nMOS transistor M13 and pMOS transistor M12 is connected to node ND1 to which the gate of said voltage step up driving pMOS transistor M1 is connected. Also, pull up pMOS transistor M16, which is cut off by enabling signal LCD of a high level being input to the gate, is connected between said node ND1 and the $V_{DD}$ line.

Though omitted in FIG. 3, nMOS transistor M17 is connected between node ND1 and nMOS transistor M2 which preliminarily steps up the $V_{DL}$ line by mandatorily stepping down the potential of node ND1 in the concrete circuit example of FIG. 4. This nMOS transistor M17 operates in connection with nMOS transistor M13 by being connected in parallel to nMOS transistor M13 composing third current mirror circuit CM3 and the gate being made common, and restricts the current during the potential step down in node ND1. By it, preliminary voltage step up of the $V_{DL}$ line being executed excessively is prevented effectively.

Also, nMOS transistor M18 which conducts only during access by enabling signal LCD being input to the gate is connected between the $V_{SS}$ line and the drain of voltage step up driving pMOS transistor M1. This nMOS transistor M18 has a longer gate length than other transistors, small size, and has a low drive ability.

Furthermore, to the $V_{DL}$ line, two pairs R1 and C3, R2 and C4 of elements of a resistor and capacitor connected in series with a transistor composition in which the source and drain are common are respectively connected between the $V_{SS}$ lines in order to eliminate the AC component thereof.

Figure 5:
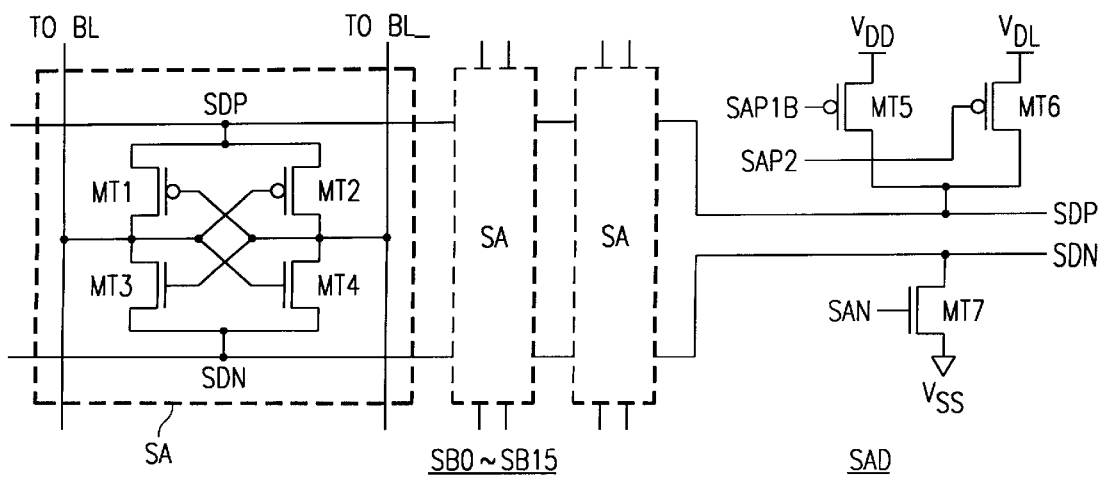
FIG. 5 is a figure showing the sense amplifier within the sense amplifier bank and the sense amplifier driving circuit normally provided at the area intersecting the power supply voltage feed line.

FIG. 5 is a figure showing the sense amplifier array within sense amplifier banks SB0–SB16 and the sense amplifier driving circuit normally provided at the intersecting area with the power supply voltage feed line.

Sense amplifier SA is comprised of pMOS transistors MT1 and MT2 and nMOS transistors MT3 and MT4 in which the sources are connected in common. The drains of pMOS transistor MT1 and nMOS transistor MT3 are mutually connected and the connection point thereof is connected to the gate of pMOS transistor MT2, the gate of nMOS transistor MT4, and bit line BL. Similarly, the drains of pMOS transistor MT2 and nMOS transistor MT4 are mutually connected and the connection point thereof is connected to the gate of pMOS transistor MT1, gate of nMOS transistor MT3, and bit supplementary line BL__. The common source of pMOS transistors MT1 and MT2 is connected to source drive line SDP on the pMOS amplifier side and the common source of nMOS transistors MT3 and MT4 is connected to source drive line SDN on the nMOS amplifier side.

On the other hand, sense amplifier driving circuit SAD is comprised of pMOS transistors MT5 and MT6 and nMOS transistor MT7.

The drain of pMOS transistor MT5 and the drain of pMOS transistor MT6 are both connected to source drive line SDP on the pMOS amplifier side, the source of pMOS transistor MT5 is connected to the $V_{DD}$ line, and the source of pMOS transistor MT6 is connected to the $V_{DL}$ line. pMOS transistor MT5 connects source drive line SDP to the $V_{DD}$ line only at the initial stage of the readout operation period by OVD drive signal SAP1B being impressed to the gate thereof. pMOS transistor MT6 connects source drive line SDP to the $V_{DL}$ line from the middle of the readout operation period in overdrive by pMOS amplifier drive signal SAP2 being impressed to the gate thereof.

On the contrary, in nMOS transistor (MT7), the drain thereof is connected to source drive line SDN on the nMOS amplifier side, the source is connected to the $V_{SS}$ line, and by nMOS amplifier drive signal SAN being impressed to the gate, connects source drive line SDN to the $V_{SS}$ line in the middle of the sense amplifier drive period during the readout operation.

Next, the operation of the VDL generator thus composed will be explained using the timing chart in FIG. 6.

In FIG. 4, active high enabling signal LCD is left as is at "L" in the initial state so all pull up pMOS transistors M14–M16 are ON, the common gates of current mirrors CM1 and CM2 comprised of pMOS transistors M5, M10 and M7, M12 are held at external power supply voltage $V_{DD}$, external power supply voltage $V_{DD}$ is impressed to output node ND1 of the VDL sensor, and differential pair activating pMOS transistor M1 is in the OFF state. Reference voltage REF is held at a voltage of $V_{DL}/2$ or slightly lower than that, for example, 1.05–1.1 V.

When external clock signal RASB which controls the readout operation start makes a transition to "L" from "H" in this state, enabling signal LCD rises to "H" from "L." By it, all pull up pMOS transistors M14–M16 in FIG. 4 are turned OFF and differential pair activating nMOS transistor M9 is turned ON.

Next, nMOS amplifier drive signal SAN rises to "H" from "L" in sense amplifier driving circuit SAD of FIG. 5 and OVD drive signal SAP1B falls to "L" from "H." By it, nMOS transistor MT7 and pMOS transistor MT5 are turned ON, common voltage $V_{SS}$ is impressed to sense amplifier drive line SDN on the nMOS side and external power supply voltage $V_{DD}$ to sense amplifier drive line SDP on the pMOS side, and sense amplifier SA is driven.

As noted above, the initial drive of sense amplifier (SA) is executed with high power supply voltage $V_{DD}$ (e.g., 3.3 V) in the OVD system so sense amplifier SA rapidly magnifies the slight voltage difference in bit pair lines BL and BL__ readout from the memory cell.

Preliminary voltage step up signal MVDL rises from "L" to "H" at the same activating timing as OVD drive signal SAP1B. Consequently, preliminary voltage step up driving nMOS transistor M2 is turned ON, the voltage between the source and drain of extracted current adjusting nMOS transistor M17 becomes high in accordance, and current determined by the bias state of nMOS transistor M17 at this time flows into $V_{SS}$ from node ND1. When the potential of output node ND1 of VDL sensor 40 falls from $V_{DD}$ according to said current extraction, voltage step up driving pMOS transistor M1 is turned ON, the $V_{DL}$ line is connected to the $V_{DD}$ line, and the potential of the $V_{DL}$ line steps up.

The potential of voltage monitoring node ND2 also steps up according to said step up in the potential of the $V_{DL}$ line and current (i1) flowing in differential pair nMOS transistor M8 increases. Consequently, the current fed to node ND1 from pMOS transistor M12 composing second current mirror circuit CM2 increases, the potential of node ND1 steps up, and voltage step up driving pMOS transistor M1 is cut off again. Namely, voltage step up driving pMOS transistor M1 is turned ON only for a prescribed time according to current extraction of node ND1 and as a result, the $V_{DL}$ line is stepped up to a voltage higher than working internal power supply voltage $V_{DL}$ as shown in FIG. 6.

Drive period (OVD period) of the sense amplifier according to external power supply voltage $V_{DD}$ ends by raising OVD drive signal SDP1B to "H" from "L" and dropping pMOS amplifier drive signal SAP2 to "L" from "H." At this time, pMOS transistor MT5 in FIG. 5 is turned OFF, pMOS transistor MT6 is turned ON, the power supply voltage fed to pMOS amplifier drive line SDP is changed to $V_{DL}$ from $V_{DD}$. During this power change, the internal power source which feeds $V_{DL}$ is weak in drive ability (voltage feeding ability) compared to the external power source which was feeding $V_{DD}$, so the potential of the $V_{DL}$ line steps down instantaneously as shown in FIG. 6. When the potential step down in the $V_{DL}$ line is transmitted directly to voltage monitoring node ND2 according to capacitors C1 and C2 in FIG. 4, this time, current (i2) increases and current (i1) decreases. Whereas the current flowing in pMOS transistors M7 and M12 composing second current mirror circuit CM2 decreases due to decrease in current (i1), current (i3) flowing in the other first current mirror CM1 increases, thus nMOS transistor M13 extracts current (i4) of same quantity as current (i3) to the $V_{SS}$ side in third current mirror circuit CM3. As a result, the potential of node ND1 steps down, pMOS transistor M1 is driven, and the $V_{DL}$ line is raised. This voltage step up operation is feedback controlled by the voltage monitor of the $V_{DL}$ line, so the potential of the $V_{DL}$ line continues to be restored to internal power supply voltage $V_{DL}$.

After the bit line voltage is readout to the data line, sense amplifier drive signals SAN and SAP2 are returned to the initial state and when external clock signal RASB becomes "H" from "L," enabling signal LCD makes a transition to "L" from "H" and the VDL generator in FIG. 4 takes on the stop state.

FIG. 7 is a figure showing the result obtained by simulating the potential change in the bit pair line and node ND1 with the pulse width of preliminary voltage step up signal MVDL, namely, the preliminary voltage step up time as the parameter.

It is apparent from FIG. 7 that bit line voltage of 2.0 V can be secured at 40 nsec after activating sense amplifier SA even if pulse width $t_{BST}$ of preliminary voltage step up signal MVDL (refer to FIG. 6) is less than 5 nsec. The OVD time at this time is set at 8 nsec.

In the VDL generator of this embodiment, it is possible to step up the $V_{DL}$ line to a voltage higher than internal power supply voltage $V_{DL}$ prior to the change when changing the power supply voltage to $V_{DL}$ from $V_{DD}$ at the end of OVD. Consequently, even if there is an instantaneous potential step down in the $V_{DL}$ line originating in the fact that the drive ability (voltage feeding ability) of the internal power source which feeds $V_{DL}$ is weaker than the external power source which was feeding $V_{DD}$ during the power change, the step down value from the $V_{DL}$ level is less than in the conventional technology and potential restoration thereafter can be executed quickly. Also, capacitors C1 and C2 which accumulate charge are provided so a great potential step down can be prevented since the accumulated charge thereof can be made appropriate to the instantaneous potential step down of the $V_{DL}$ line. In addition, capacitors C1 and C2 are connected to potential monitoring node ND2, and the instantaneous step down of the $V_{DL}$ line is transmitted according to capacitive coupling so feedback of the step down value in the $V_{DL}$ line potential is fast.

Generally, there is a gap in the amplification speed of the bit line potential by the sense amplifier depending on the difference in the drive ability of the transistor and the wiring load, and bit line BLfc of fast voltage step up speed (bit line of the first corner) and bit line BLsc of slow voltage step up speed as shown in FIG. 6(h). Conventionally, power change was executed after sufficiently stepping up to about 2.2 V by exceeding the period for being sufficiently stepped up in said slow corner bit line BLsc, namely, in order to reduce the influence of the potential step down in the $V_{DL}$ line so the OVD period was set longer than necessary. In the DRAM of this embodiment, the potential step down value of the $V_{DL}$ line is small during the power change even if the potential to be stepped up in the OVD period is set low, for example, about 2.0 V so the potential step down at this time does not cause a decrease in the drive ability of the sense amplifier. Therefore, the OVD period can be made shorter than the conventional technology and high speed readout becomes possible.

Also, VDL generators are scattered within the chip so the voltage feeding ability of each VDL generator can be made low and the occupying area is small so the degree of freedom in the layout is great. Also, in addition to being able to make the distance from the VDL generator (voltage generating circuit) to the sense amplifier short, reducing the wiring capacity, and making high speed readout possible, the advantages in the characteristics and design are great, such as being able to equalize the drive ability between the sense amplifiers, etc.

As explained above, according to the semiconductor device related to the present invention, a voltage generating circuit is provided which steps up the internal power supply line to the necessary voltage which is higher than the internal power supply voltage (working voltage) before making the change when changing over the power supply voltage fed to the sense amplifier from the external to the internal power supply voltage during the readout operation period, such as overdrive, so even if there is an instantaneous potential step down in the internal power line originating in the difference of the power ability, etc., the potential step down value thereof is less than in the conventional technology and potential restoration (voltage step up) thereafter can be executed quickly. Also, a capacitor for accumulating charge is provided so the accumulated charge thereof is made appropriate to the instantaneous potential step down of the internal power line, and as a result, great potential step down can be prevented. In addition, the instantaneous potential step down of the internal power line is transmitted via said capacitor so the feedback is fast.

Also, in the semiconductor device of the present invention, the potential step down value of the internal power supply voltage line is small during the power change even if the potential level to be raised by the external power supply voltage is set lower than the conventional technology, so the potential step down at this time does not cause a decrease in the drive ability of the sense amplifier, etc. Therefore, the OVD period can be made shorter than in the conventional technology, so high speed readout becomes possible in the semiconductor memory of the present invention.

Furthermore, the voltage step up circuit is scattered within the chip so the voltage feeding ability of each voltage generating circuit can be made low and the occupied area is small, so the degree of freedom in the layout is great. Also, in addition to being able to make the distance from the voltage generating circuit to the sense amplifier short, reducing the wiring capacity, and making high speed readout possible, advantages in the characteristics and design are great, such as being able to equalize the drive ability between the sense amplifiers, etc.

What is claimed is:

1. A semiconductor memory circuit comprising:
   a sense amplifier coupled to a memory array;
   an internal power supply providing a first voltage level for powering said sense amplifier;
   a voltage generating circuit for stepping up said first voltage to a higher voltage by coupling an external power supply voltage at a second voltage level to an output of said internal power supply for a predetermined time period, said second voltage level being higher than said first voltage level.

2. The semiconductor memory of claim 1 wherein said voltage generating circuit has a detecting circuit which detects said first voltage level, a first switching element connected between an output of said internal power supply and said external power supply voltage and which is operated according to the detection result of said detecting circuit, and a second switching element connected between the connection node of said detecting circuit and said first switching element and a common voltage.

3. The semiconductor memory of claim 2 wherein said detecting circuit comprises a comparing circuit which compares a divided voltage at said output of said internal power supply with a prescribed reference voltage and drives said first switching element according to the comparison result.

4. The semiconductor memory of claim 1 further comprising a capacitor connected between said output of said internal power supply voltage and said common voltage wherein accumulated charge value increases as said output voltage is stepped up to a voltage higher than a working voltage.

5. The semiconductor memory of claim 3 further comprising two capacitors connected respectively between said potential detection node of said detecting circuit and said output of said internal power supply and between said potential detection node and said common voltage wherein accumulated charge value increases as said output voltage is stepped up to a higher voltage.

6. The semiconductor memory of claim 1 further comprising a plurality of said voltage generating circuits for each memory array or for each memory block composed of a plurality of memory arrays, said plurality of voltage generating circuits being scattered within an area where peripheral circuits of said memory arrays are formed.

7. The semiconductor memory of claim 2 further comprising a plurality of said voltage generating circuits for each memory array or for each memory block composed of a plurality of memory arrays, said plurality of voltage generating circuits being scattered within an area where peripheral circuits of said memory arrays are formed.

8. The semiconductor memory of claim 3 further comprising a plurality of said voltage generating circuits for each memory array or for each memory block composed of a plurality of memory arrays, said plurality of voltage generating circuits being scattered within an area where peripheral circuits of said memory arrays are formed.

9. The semiconductor memory of claim 4 further comprising a plurality of said voltage generating circuits for each memory array or for each memory block composed of a plurality of memory arrays, said plurality of voltage generating circuits being scattered within an area where peripheral circuits of said memory arrays are formed.

10. The semiconductor memory of claim 5 further comprising a plurality of said voltage generating circuits for each memory array or for each memory block composed of a plurality of memory arrays, said plurality of voltage generating circuits being scattered within an area where peripheral circuits of said memory arrays are formed.

* * * * *